(12) United States Patent
Cheng et al.

(10) Patent No.: US 7,736,965 B2
(45) Date of Patent: Jun. 15, 2010

(54) METHOD OF MAKING A FINFET DEVICE STRUCTURE HAVING DUAL METAL AND HIGH-K GATES

(75) Inventors: Kangguo Cheng, Guilderland, NY (US); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 11/951,552

(22) Filed: Dec. 6, 2007

(65) Prior Publication Data
US 2009/0148986 A1 Jun. 11, 2009

(51) Int. Cl.
*H01L 21/336* (2006.01)
(52) U.S. Cl. .............. 438/197; 438/149; 438/176; 438/283; 438/268; 257/308; 257/465; 257/E21.014
(58) Field of Classification Search .............. 438/197, 438/157, 268; 257/391, 392, E21.052, 421, 257/444, 635
See application file for complete search history.

(56) References Cited

U.S. PATENT DOCUMENTS

| | | | |
|---|---|---|---|
| 6,373,111 B1 * | 4/2002 | Zheng et al. | 257/407 |
| 6,403,434 B1 | 6/2002 | Yu | |
| 6,413,802 B1 * | 7/2002 | Hu et al. | 438/151 |
| 6,495,437 B1 | 12/2002 | Yu | |
| 6,551,885 B1 | 4/2003 | Yu | |
| 6,657,252 B2 | 12/2003 | Fried et al. | |
| 6,756,277 B1 | 6/2004 | Yu | |
| 6,787,406 B1 | 9/2004 | Hill et al. | |
| 6,787,424 B1 | 9/2004 | Yu | |
| 6,869,868 B2 | 3/2005 | Chiu et al. | |
| 6,992,354 B2 | 1/2006 | Nowak et al. | |
| 7,041,601 B1 | 5/2006 | Yu et al. | |
| 7,049,662 B2 | 5/2006 | Natzle et al. | |
| 7,071,122 B2 | 7/2006 | Saenger et al. | |
| 7,105,390 B2 * | 9/2006 | Brask et al. | 438/149 |
| 7,187,046 B2 | 3/2007 | Wu et al. | |
| 7,262,084 B2 | 8/2007 | Zhu et al. | |
| 2005/0280104 A1 * | 12/2005 | Li | 257/406 |

OTHER PUBLICATIONS

Yang-Kyu Choi et al., "A Spacer Patterning Technology for Nanoscale CMOS", IEEE Transactions on Electron Devices, vol. 49, No. 3, Mar. 2002, pp. 436-441.
VLSI Technology, by S. M. Sze, 2nd Edition, Lib. Congress #TK7874.V566 1988 621.381 '73. 87-22803.
Bin Yu et al., "FinFET Scaling to 10nm Gate Length", 0-7803-7463-X, 2002 IEEE, 4 pages.

* cited by examiner

*Primary Examiner*—Charles D Garber
*Assistant Examiner*—Yasser A Abdelaziez
(74) *Attorney, Agent, or Firm*—Joseph P. Abate

(57) ABSTRACT

Methods include making a FinFET device structure having multiple FinFET devices (e.g. ntype and/or ptype) with different metal conductors and/or different high-k insulators in the gates formed on a SOI substrate. One such method includes removing a second semiconductor layer from a second metal layer in a region above a second cap layer, from adjoining regions and from regions adjacent to a second fin.

12 Claims, 16 Drawing Sheets

METHOD OF MAKING A FINFET DEVICE STRUCTURE HAVING DUAL METAL AND HIGH-K GATES

BACKGROUND OF THE INVENTION

1. Field of the Invention

The present invention relates to methods used to fabricate semiconductor devices and, more particularly, to methods of fabricating FinFET device structures.

2. Description of the Related Art

The FinFET device in general is well known. The FinFET device is one of the technical alternatives to planar transistors, in order to continue scaling down the sizes of transistors—for example, to 32 nm and smaller.

In general, a FinFET device is a non-planar, double gate transistor formed on a substrate such as a silicon-on-insulator (SOI) substrate. In the FinFET device, an electrically conductive channel is wrapped around a thin semiconductor (e.g., silicon) "fin" which forms a body of the device. The dimensions of the fin essentially determine an effective channel length of the device.

A gate including a metal conductor and a high-k dielectric further helps scaling by reducing polysilicon depletion and gate leakage.

To help meet different requirements of FinFET devices, it is sometimes desirable to have multiple FinFET devices with different characteristics such as different threshold voltages ($V_t$) formed on a same SOI substrate.

FinFET device structures with multiple devices having metal conductor and high-k insulator gates formed on the same semiconductor or SOI substrate are known. See, for example:

U.S. Pat. No. 7,105,390 B2, filed Dec. 30, 2003, issued Sep. 12, 2006, NON PLANAR TRANSISTORS WITH METAL GATE ELECTRODES, by Justin K. Brask et al.; U.S. Pat. No. 7,187,046 B2, filed Apr. 26, 2004, issued Mar. 6, 2007, METHOD OF FORMING AN N CHANNEL AND P CHANNEL FINFET DEVICE ON THE SAME SEMI-CONDUCTOR SUBSTRATE, by Chung-Chen Wu et al.

Although the known FinFET devices and methods of their manufacture are helpful, the present inventors believe that further improvements (e.g., cost, flexibility) in methods of manufacturing FinFET devices on the same substrate are achievable.

SUMMARY OF THE INVENTION

According to the present invention, methods are taught herein for making a FinFET device structure having multiple FinFET devices (e.g., n type and/or p type) with different metal conductors and/or different high-k insulators in the gates formed on a same SOI substrate.

It is a principal object of the present invention to provide a method of making multiple FinFET devices having different electrical characteristics on the same SOI substrate.

It is a further object of the present invention to provide a method of fabricating a NMOS FinFET and a PMOS FinFET having gates with different compositions (chemical and/or dimensional) on the same SOI substrate.

According to a preferred embodiment of the present invention, a method of making or fabricating a FinFET device structure includes:

providing a semiconductor-on-insulator (SOI) substrate having a semiconductor layer on an insulating layer on a base (e.g., semiconductor) layer;

forming a cap layer (e.g., silicon nitride) on the SOI substrate;

forming, on the insulating layer, first and second semiconductor fins with a first cap layer on the first fin and a second cap layer on the second fin;

providing a first high-k dielectric layer across the first and the second cap layers and the first and second fins;

providing a first metal layer onto the first high-k dielectric layer;

providing a first semiconductor layer onto the first metal layer;

removing the first semiconductor layer, the first metal layer, and the first high-k dielectric layer from the second cap layer, the second fin and from regions adjacent to the second fin;

providing a second high-k dielectric layer onto the second cap layer, the second fin and a portion of the first metal layer;

providing a second metal layer onto the second high-k dielectric layer, the second metal layer having a composition different than the first metal layer;

providing a second semiconductor layer onto the second metal layer in a region above the second cap layer and into the regions adjacent to the second fin;

removing the second semiconductor layer from the second metal layer in the region above the second cap layer, from adjoining regions and from the regions adjacent to the second fin;

removing the second metal layer and the second high-k dielectric layer from a region above the first cap layer and from adjoining regions above the first semiconductor layer;

removing the first metal layer, the first high-k dielectric layer, the first semiconductor layer, the second metal layer, the second high-k dielectric layer and the second semiconductor layer from regions above a plane containing top surfaces of the first and the second cap layers;

forming first and second gates;

forming respective source and drain regions within portions of the first and the second fins adjacent to the first and second gates, and then removing portions of the first and the second semiconductor layers, the first and the second high-k dielectric layers and the first and the second metal layers from a medial region between the first and the second fins.

Further and still other objects of the present invention will become more readily apparent when the Detailed Description is taken in conjunction with the following drawing figures.

DESCRIPTION OF THE PREFERRED EMBODIMENT

A preferred embodiment of the method according to the present invention is shown schematically (not to scale) in the sequential stages of FIGS. 1-10. A flow chart of the steps according to the preferred embodiment is shown in FIG. 11. The present inventors believe that implementing each of the steps according to the preferred embodiment of the inventive method is well within the ordinary skill of the art when taken in view of the instant specification and drawing figures. Thus, specific details of individual steps are provided herein to the extent only for one of ordinary skill to practice the invention. Further details regarding, for example, depositing, patterning, etching, implanting, doping, annealing and/or planarizing methods and techniques can be found, for example, in *VLSI Technology*, by S. M. Sze, $2^{nd}$ Edition, Lib. Congress #TK7874.V566 1988 621.381 '73. 87-22803. See also, for example, the '046 B2 patent to Wu et al. which is hereby incorporated in its entirety by reference. In addition, reference can be made to the following U.S. Patents which are hereby incorporated in their entireties by reference: U.S. Pat. No. 6,657,252 B2, filed Mar. 19, 2002, issued Dec. 2, 2003, FINFET CMOS WITH NVRAM CAPABILITY, by Fried et al.; U.S. Pat. No. 6,992,354 B2, filed Jun. 25, 2003, issued Jan. 31, 2006, FINFET HAVING SUPPRESSED PARASITIC DEVICE CHARACTERISTICS, by Nowak et al.

Figure 1:
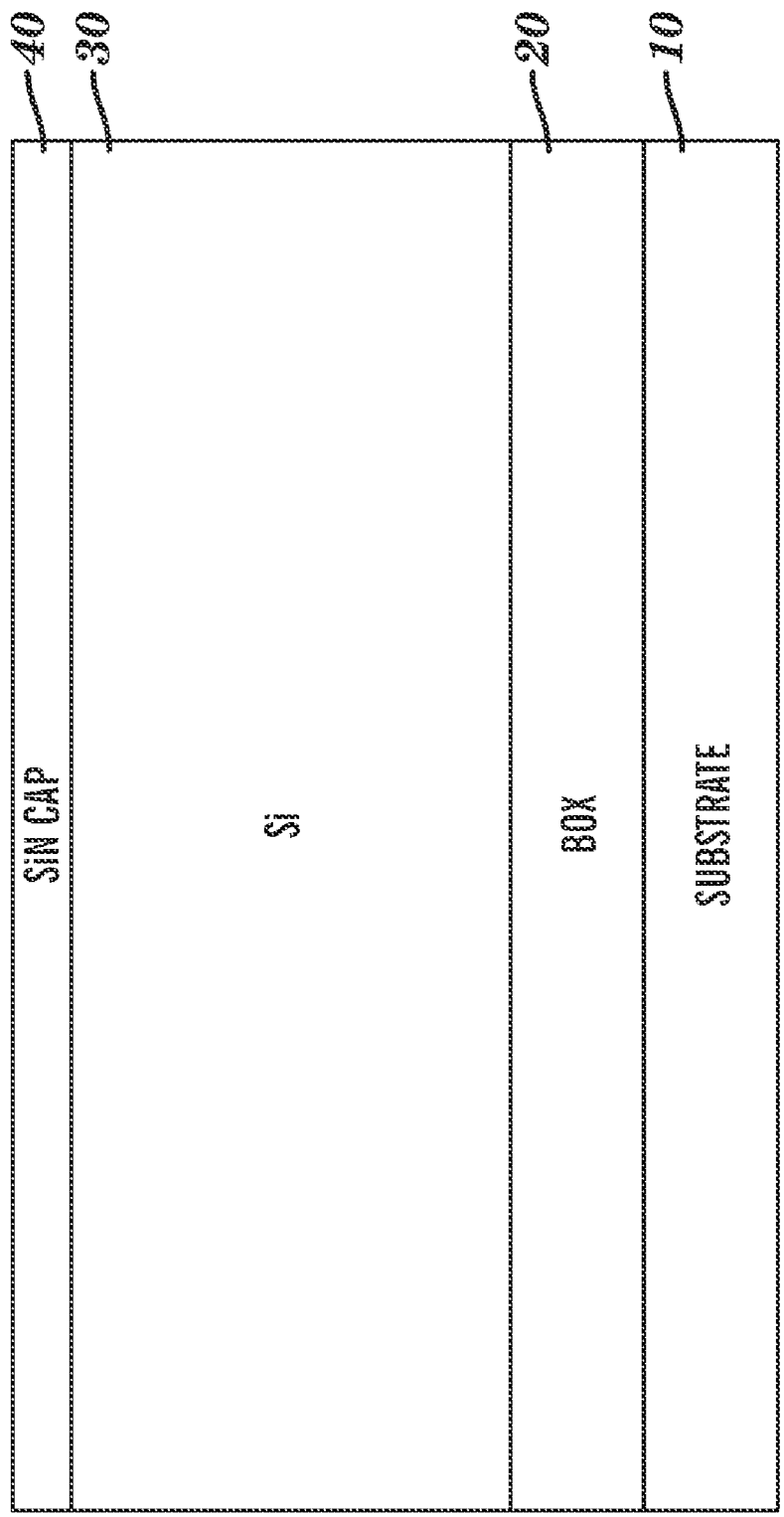
FIGS. 1-6, 7A, 7B, 8A, 8B, 9A, 9B and 9C and FIG. 10A and 10B are various side-sectional and top-planar schematic views of a preferred embodiment of the method according to the present invention.

Reference is now made to the drawing figures, and particularly to FIG. 1. See also the steps shown in FIG. 11. In a first step, provide a semiconductor-on-insulator (SOI) substrate 10, 20, 30. The SOI substrate includes a semiconductor substrate 10 provided with an insulating layer (BOX, silicon dioxide) 20 provided with a semiconductor material (e.g., Si) 30. Then, in a next step, form a cap layer 40 (e.g., silicon nitride (SiN) or other suitable material, by, for example, chemical vapor deposition (CVD)). The cap layer 40 covers, for example, the SOI substrate 10, 20, 30.

Figure 2:
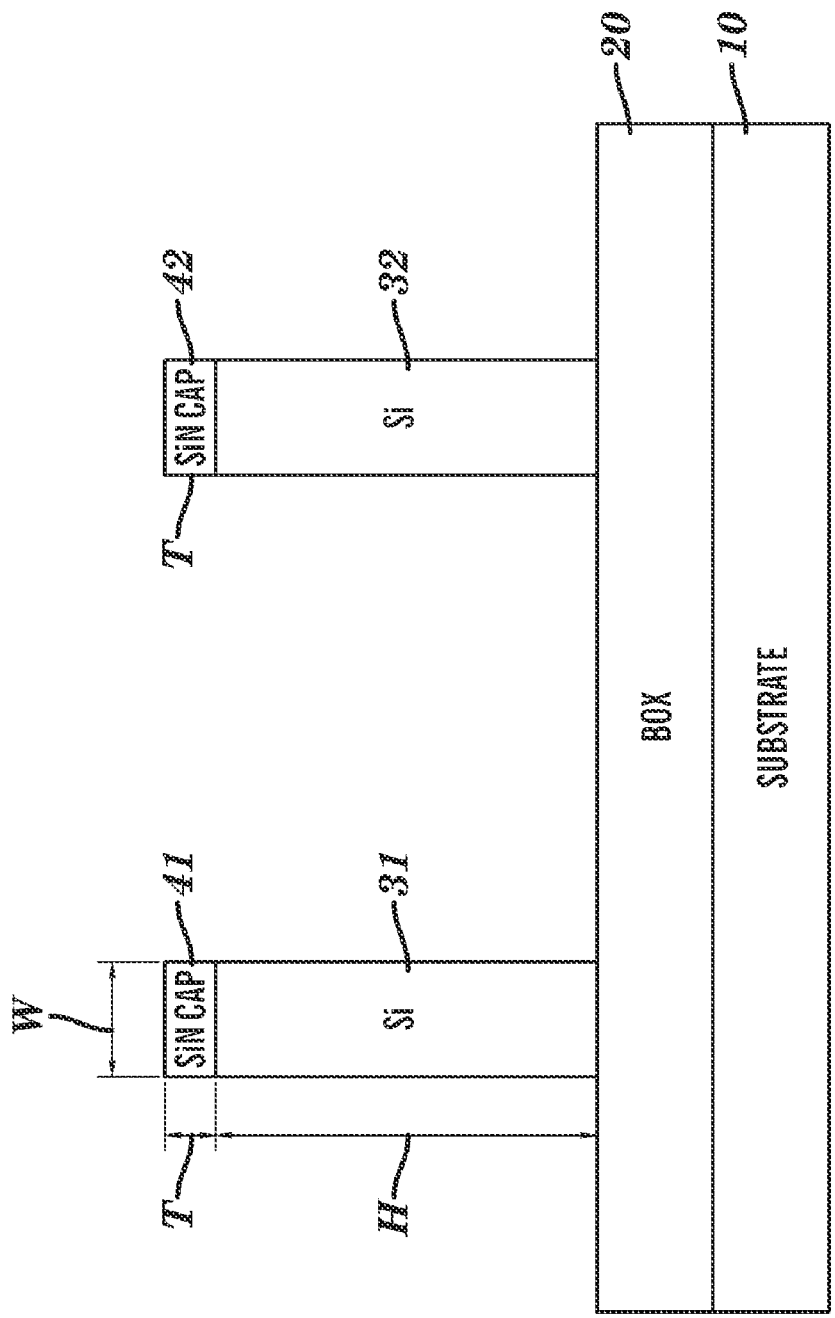

Proceeding now to the next steps as shown in FIG. 2, form first and second semiconductor fins 31, 32 with first and second SiN caps 41, 42 (the 1st fin 31 may then be "body" or "well"-doped for NFET and 2nd fin 32 may be body or well-doped for PFET, by techniques well known). However, doping the fins 31, 32 at this step is optional, and a matter of design choice. The fins 31, 32 and the caps 41, 42 can be formed by any suitable conventional lithography followed by a reactive ion etch (RIE) process well known. Alternatively, well known spacer imaging transfer techniques can be used for forming fins and caps. See, for example, the patents to Wu et al., Fried et al. or Nowak et al. for background.

Each of the fins 31, 32 (and each of the caps 41, 42) has a width (W) which is approximately (±10%) uniform and selected from the ranges: 5 nm-300 nm; more preferably, 10 nm-100 nm; and most preferably, 20 nm-50 nm. Preferably, the widths (W) of the fins 31, 32 are approximately equal.

Also, each of the fins 31, 32 has a height (H) which is approximately (±10%) uniform. Preferably, the heights (H) of the fins 31, 32 are approximately equal, but alternatively can be different depending on a particular application. Each height (H) is selected from the ranges: 5 nm-200 nm; more preferably, 10 nm-100 nm, and most preferably, 15 nm-40 nm.

Each of the SiN caps 41, 42 has a thickness (T) which is approximately uniform. Preferably, the thicknesses (T) of the caps 41, 42 are approximately equal and selected from a range of thicknesses –20 nm-50 nm. As well understood by those skilled in the art, the fins 31, 32, the caps 41, 42 and the layers 10, 20 have lengths which extend in directions into the plane of the FIG. 2.

We turn now to the next steps as explained with reference to FIG. 3. Provide (e.g., deposit) a first high-k dielectric layer 50 across the first and the second cap layers 41, 42 and across the first and the second fins 31, 32 as shown.

Examples of high-k materials for the layer 50 include metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate, and any combination of these materials. These high-k dielectric layers or films 50 are provided (e.g., deposited) by CVD (chemical vapor deposition) or ALD (atomic layer deposition) or other techniques well known. The layer 50 has an approximately uniform final thickness selected from a range of approximately 15 Angstroms to approximately 30 Angstroms.

Figure 3:
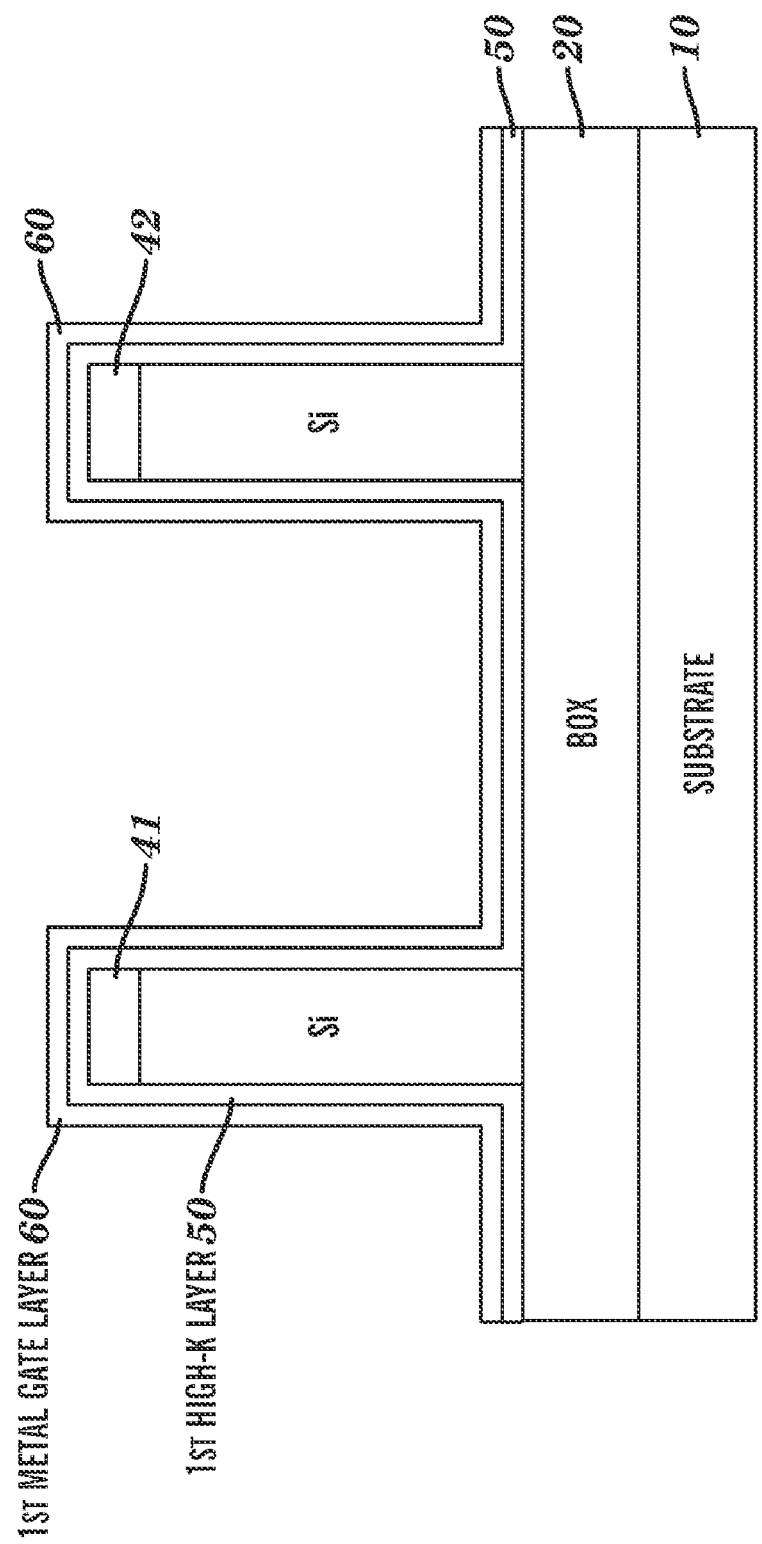

After depositing the layer 50, deposit a first metal layer 60 onto the first high-k dielectric layer 50 as shown in FIG. 3.

Examples of metal materials for the layer 60 include a metal (e.g., tungsten, titanium, tantalum, ruthenium, aluminum, platinum, silver, gold), a conducting metallic compound material (e.g., tantalum nitride, titanium nitride, tungsten silicide, tungsten nitride, titanium nitride, tantalum nitride, ruthenium oxide, cobalt silicide, nickel silicide), a carbon nanotube, conductive carbon, or any suitable combination of these materials. The metal materials are deposited by, for example, PVD (physical vapor deposition), CVD, ALD, or other suitable methods well known. Preferably, the layer 60 has an approximately uniform final thickness selected from a range of 50 Angstroms to 100 Angstroms.

Figure 4:
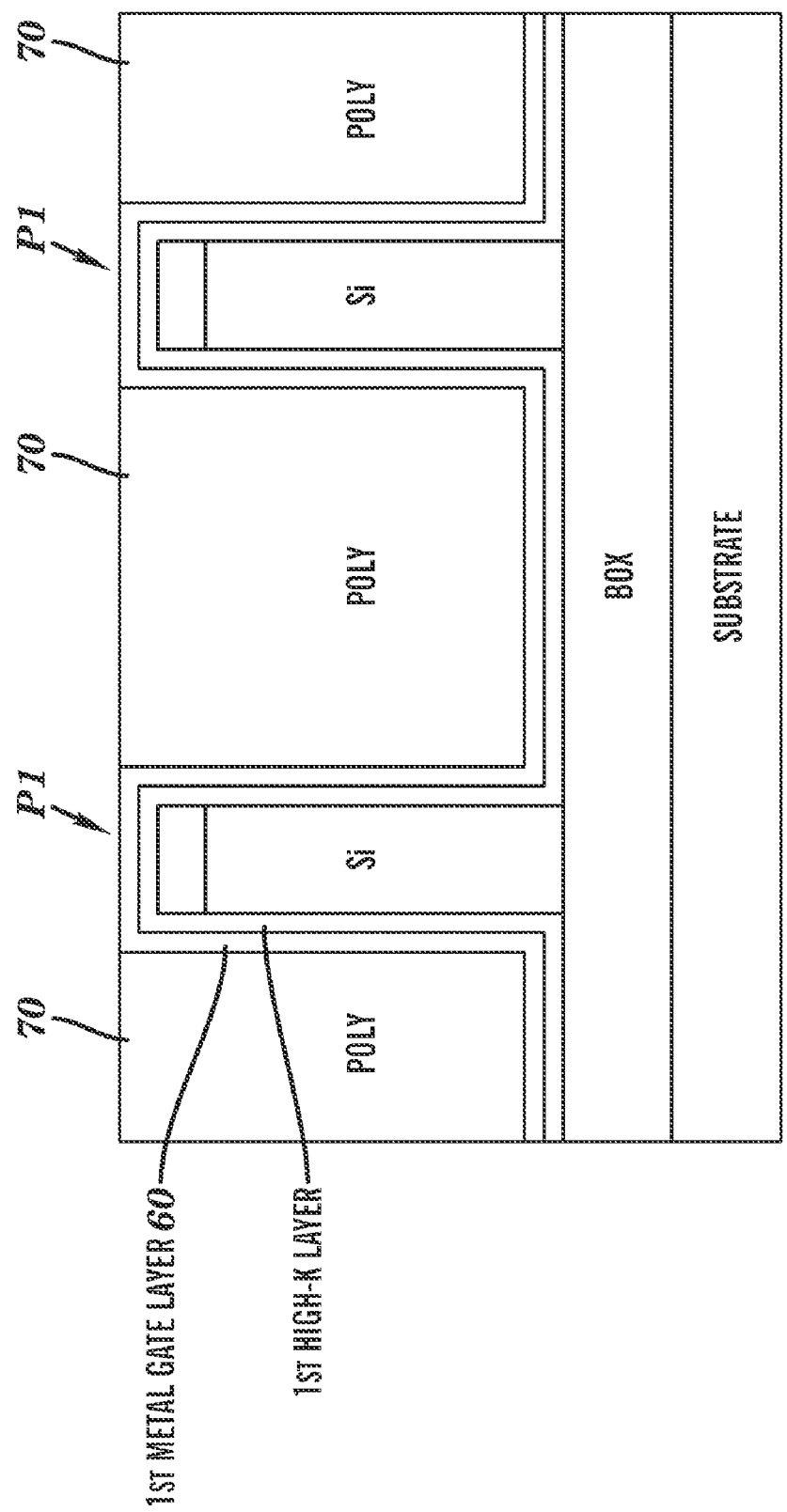

Next, as shown in FIG. 4, a polysilicon layer 70 deposition is effected by any conventional techniques such as CVD (chemical vapor deposition). Then, remove a portion (P1 shown schematically) of the polysilicon layer 70 by planarizing the polysilicon layer 70 to expose top surfaces of the first metal gate layer 60 by, for example, well known chemical mechanical polishing (CMP).

Figure 5:
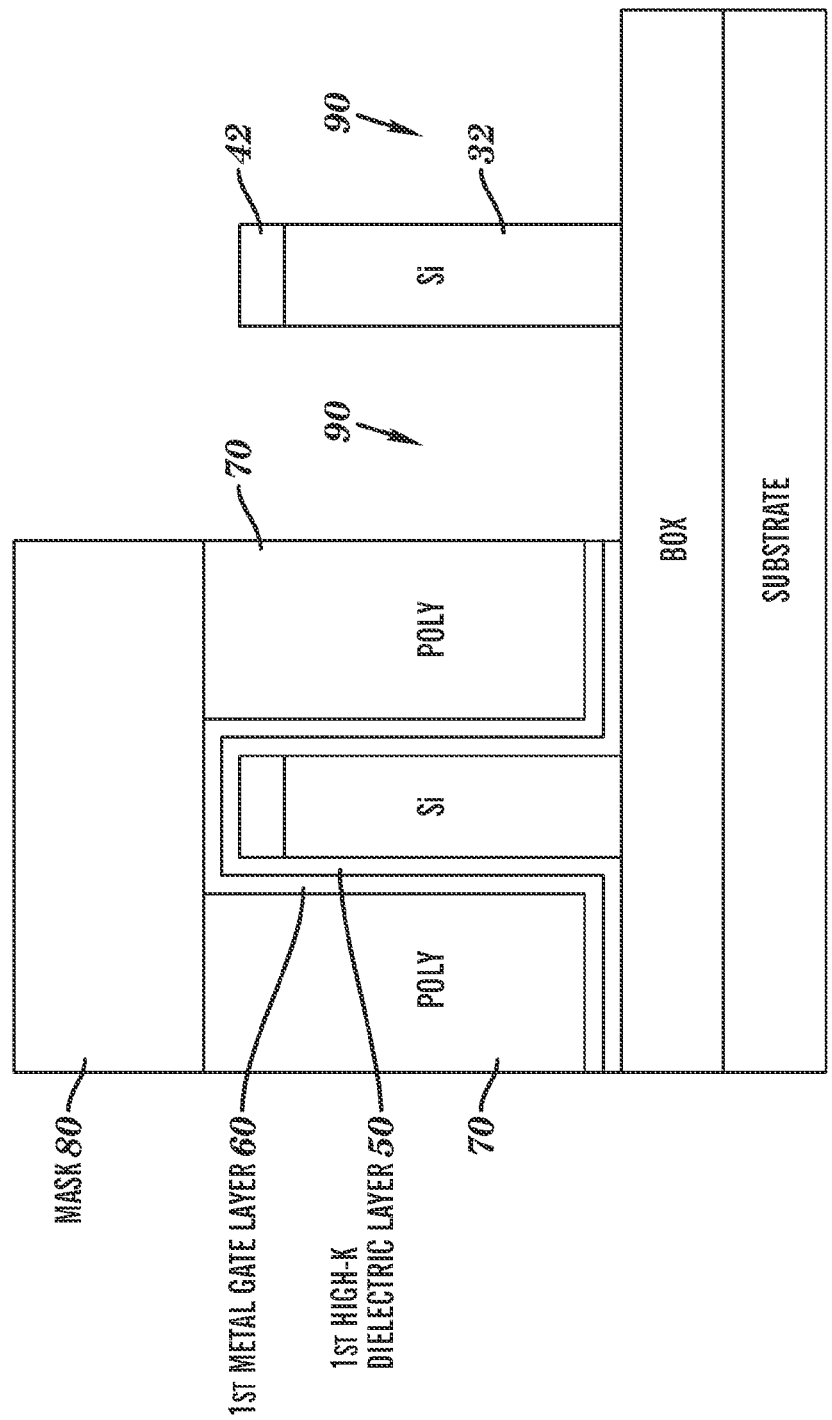

In FIG. 5, remove the first semiconductor layer 70, the first metal layer 60 and the first high-k dielectric layer 50 from the second cap layer 42, the second fin 32 and regions 90 adjacent to the second fin 32. A mask 80 provided (e.g., deposited) onto the first metal layer 60 and the poly layer 70 (adjacent to the fin 31) permits removing the poly layer 70 covering the second fin and within adjacent regions 90 by, for example, conventional reactive ion etching (RIE). Then, remove portions of the first metal layer 60 and the first high-k dielectric layer 50 by etching the layers 50, 60 from the second fin 32 and from the second cap layer 42. The resulting intermediate structure is shown in FIG. 5.

Then, remove the mask 80 by standard etching techniques.

Figure 6:
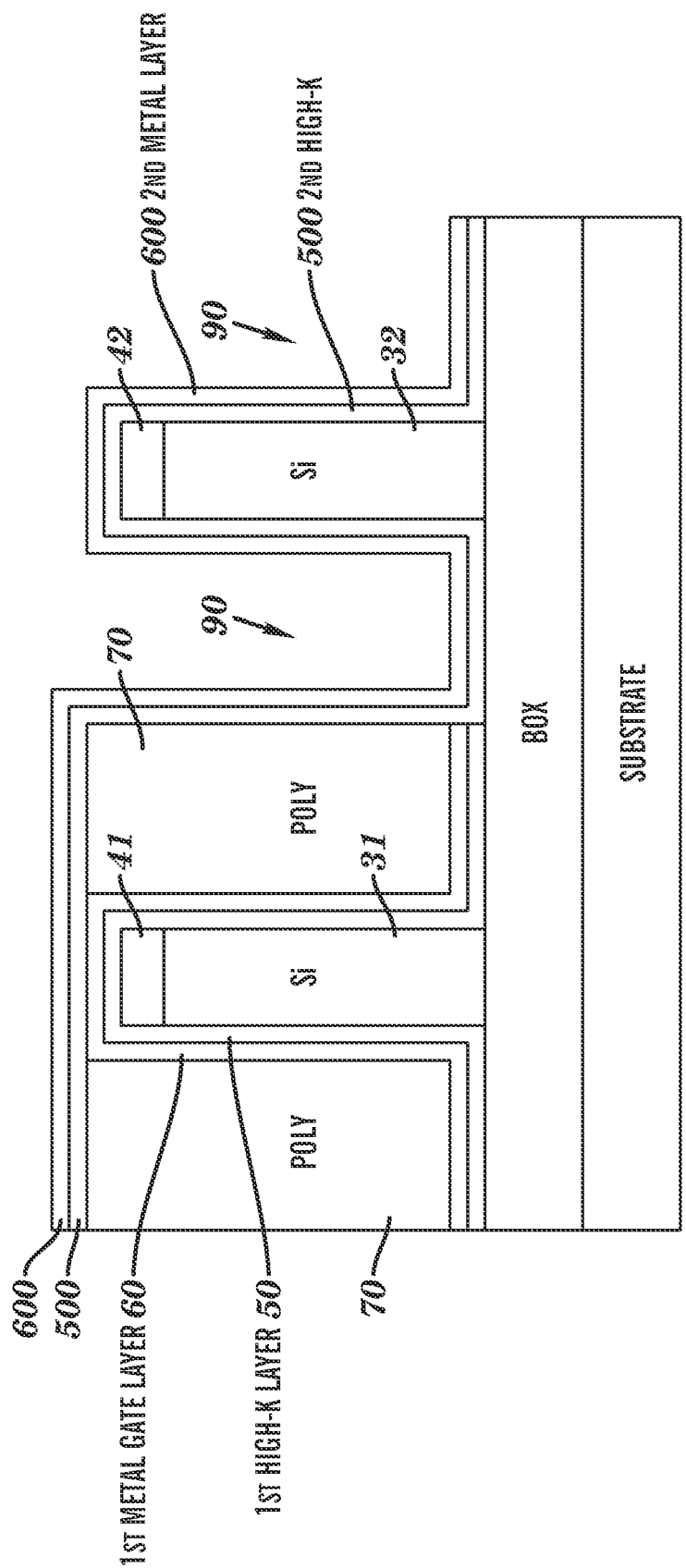

In FIG. 6, provide a second high-k dielectric layer 500 and a second metal layer 600 onto the second cap layer 42, the second fin 32, the first poly layer 70 and a portion of the first metal layer 60. Conventional deposition techniques are used.

Figure 7A:
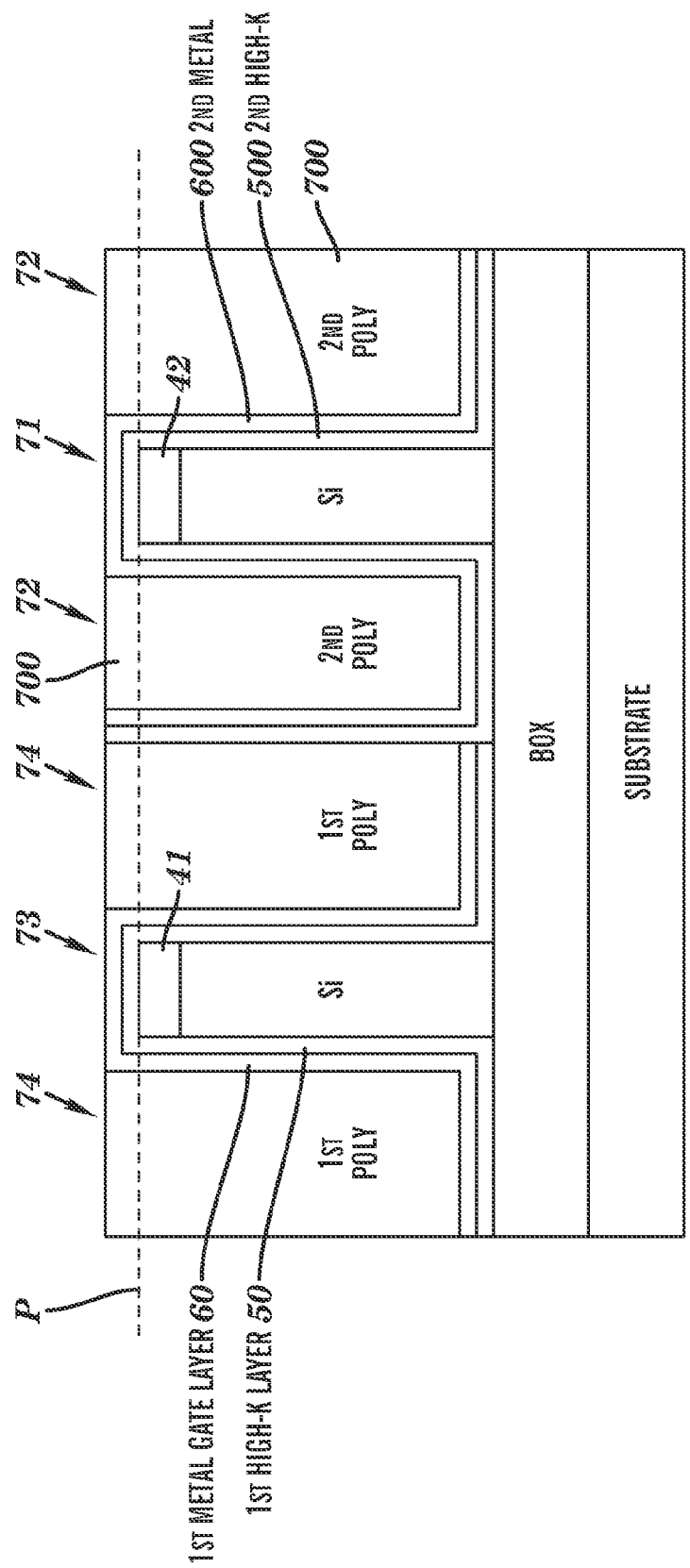
Figure 7B:
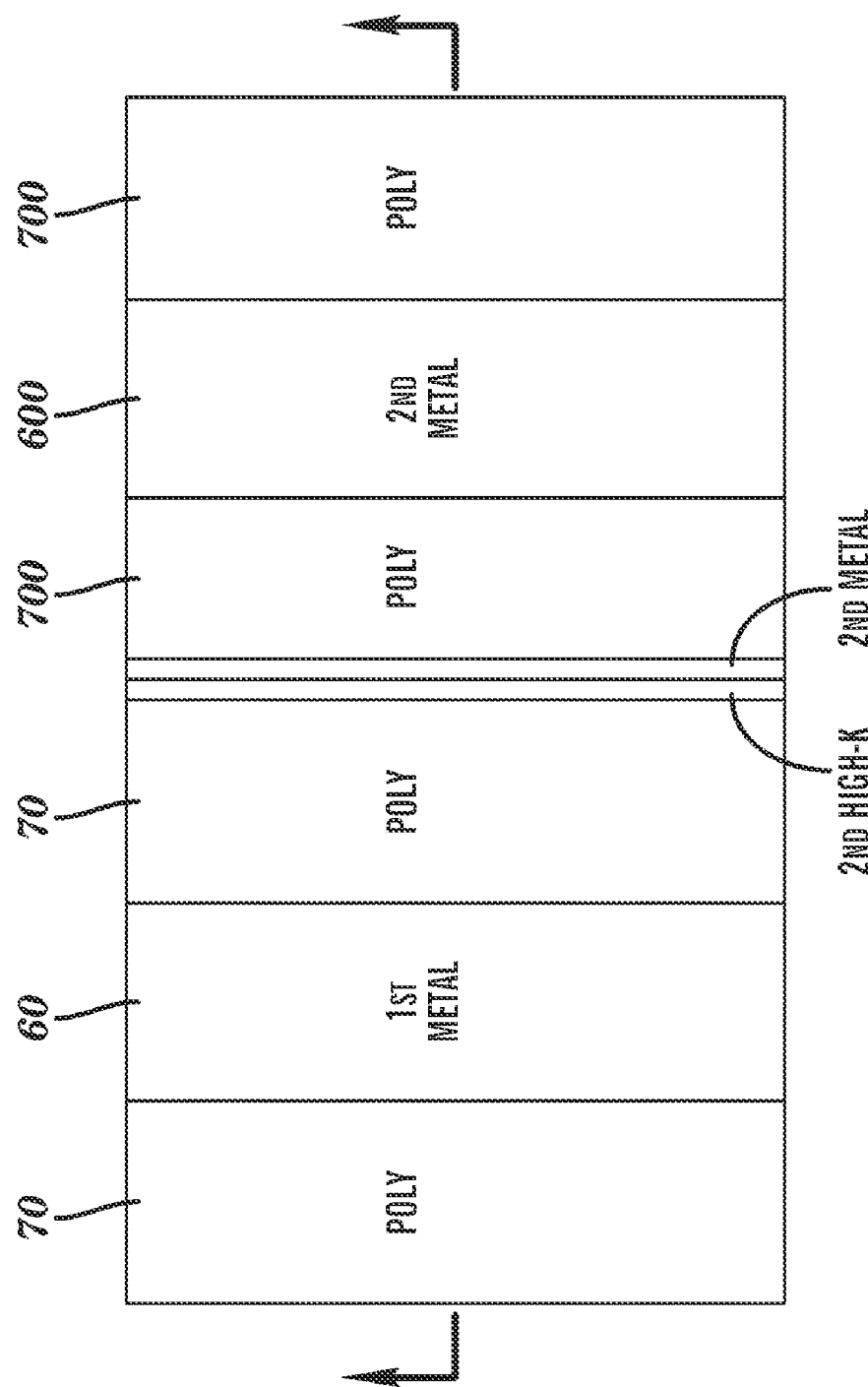

Next, provide (e.g., deposit) a second semiconductor layer 700 (FIG. 7A) onto the second metal layer 600 above the second cap layer 42 and into regions 90 adjacent to the second fin 32. For example, provide a second poly layer 700 fill by deposition. Then, remove a portion of the poly layer 700 from regions 71, 72 by CMP and/or other conventional removal techniques. Then, remove the exposed second high-k dielectric layer 500 and the second metal layer 600 above the first fin 31 (i.e., from regions 73, 74) by conventional etching. An intermediate structure after these steps is shown in FIGS. 7A (cross-sectional view) and 7B (top plan view).

Figure 8A:
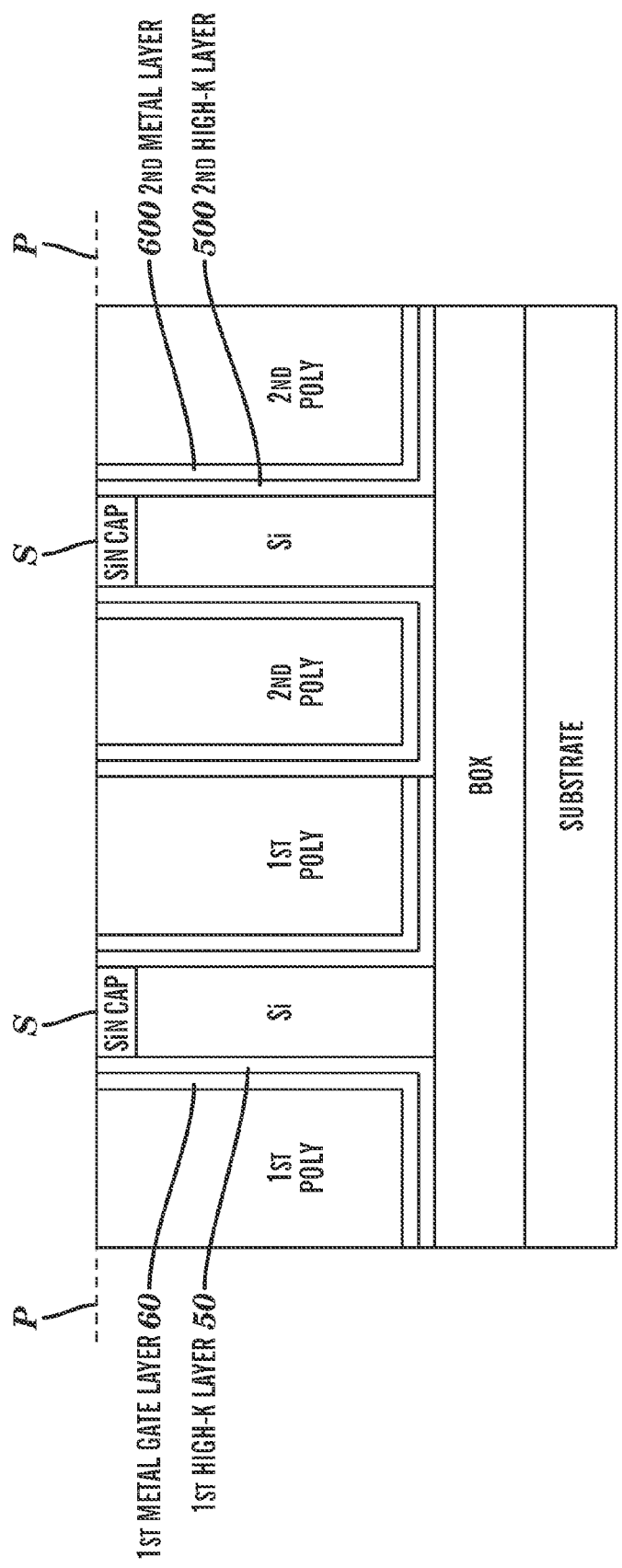
Figure 8B:
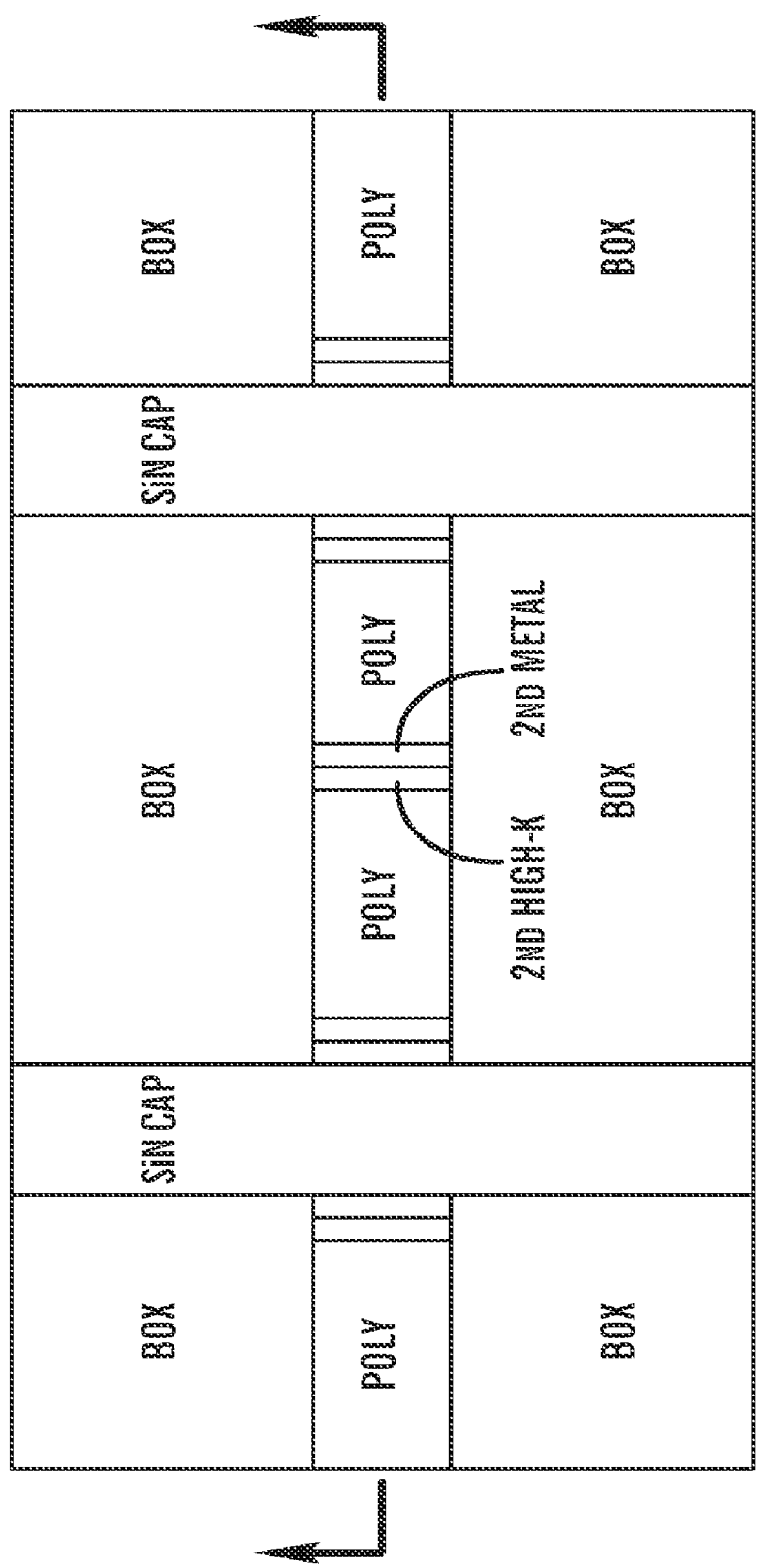

In FIGS. 8A and 8B, form the first and second gates by conventional gate patterning and etching—e.g., dry etching (RIE) and other conventional etching such that the layers 50, 60, 70, 500, 600, 700 above a plane P containing top surfaces S of the first and the second cap layers 41, 42 are removed. Optionally, the exposed first high-k and first metal layers 50, 60 on top of/above the first fin 31 and the exposed second high-k and metal layers 500, 600 on top of/above the second fin 32 are removed prior to gate patterning. The structure after forming the first gate (50, 60, 31, 41, 70) and the second gate (500, 600, 32, 46, 700) is shown in the views of FIGS. 8A and 8B. See also, for example, U.S. Pat. No. 6,992,354 B2 to Nowak et al., and the article by Choi "A Spacer Patterning Technology for Nanoscale CMOS", 0018-9383102 IEEE, for gate forming methodologies and techniques employable in the present invention.

Figure 9A:
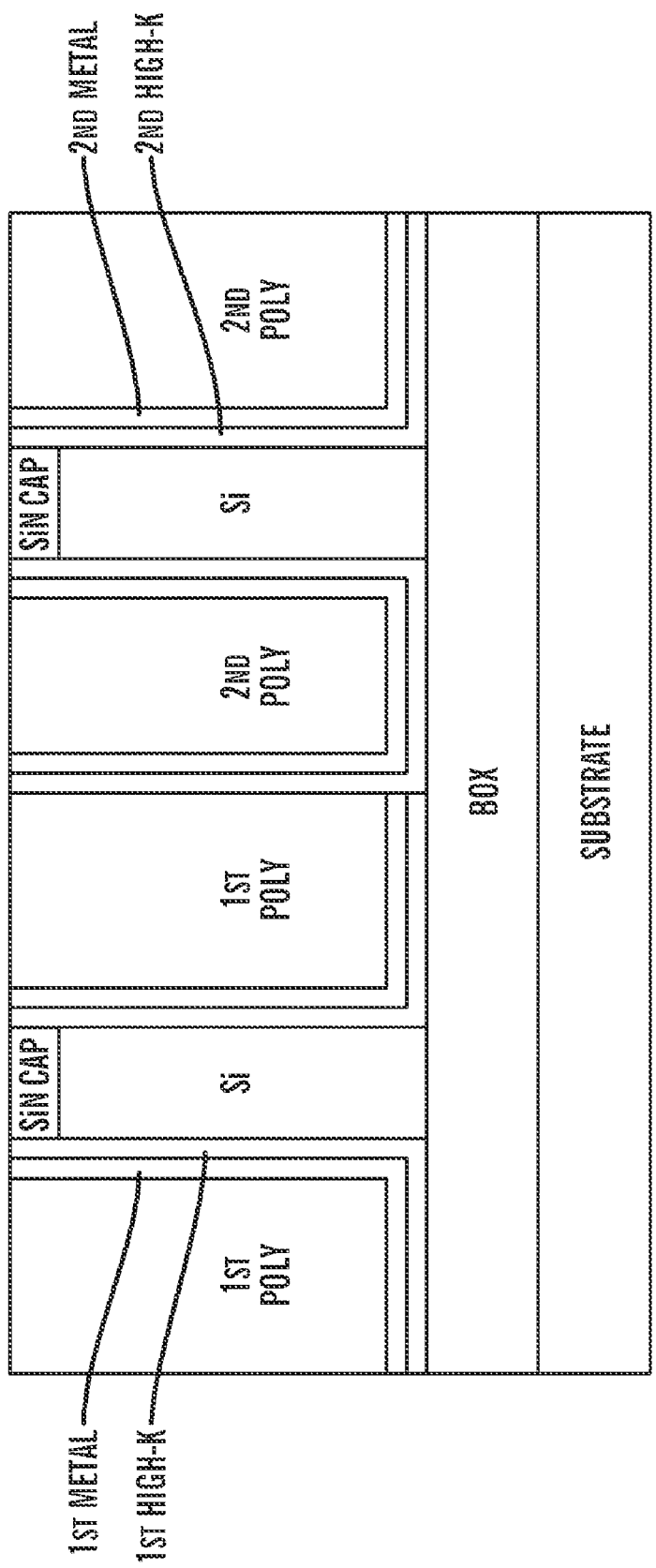
Figure 9B:
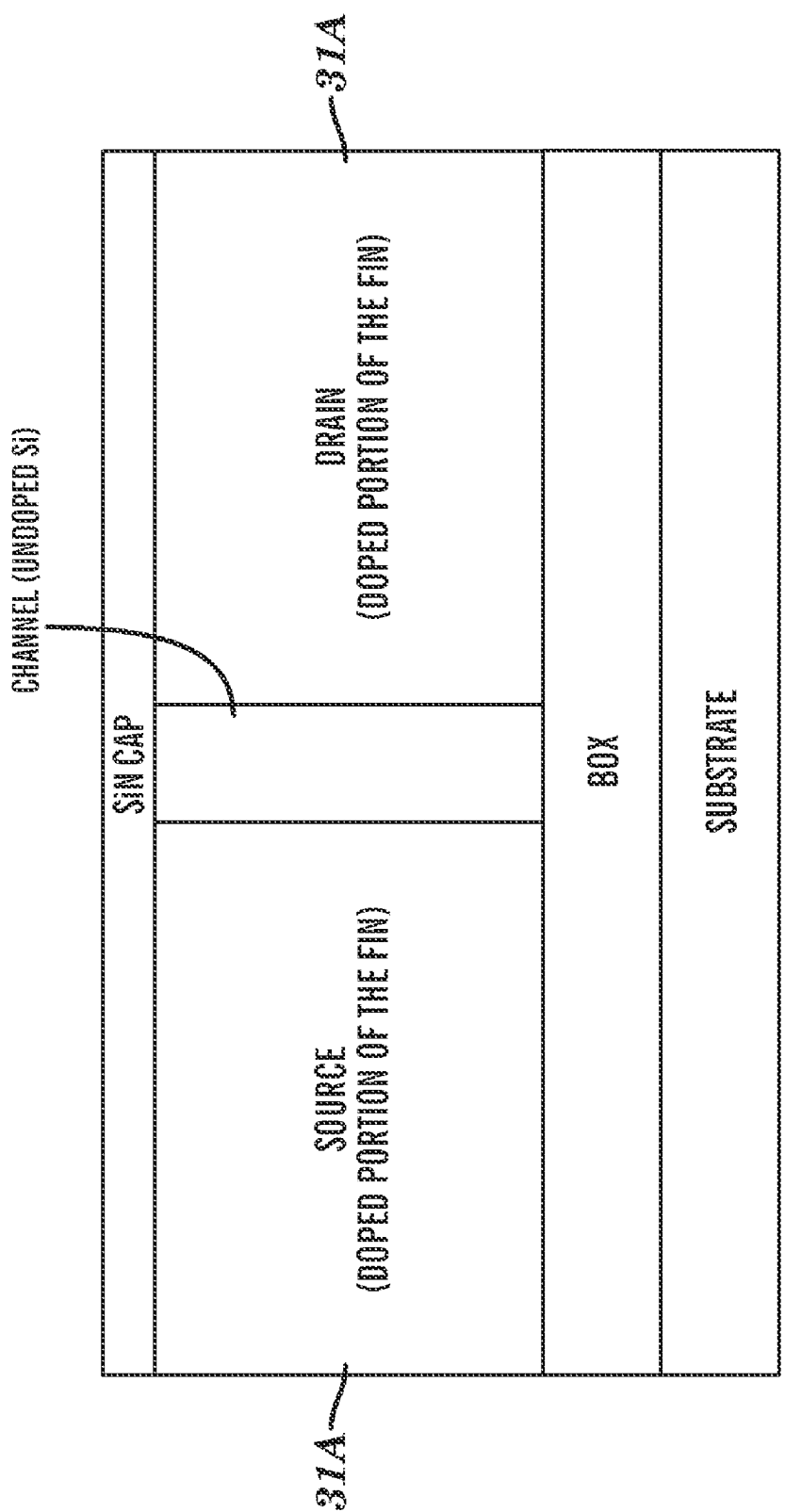
Figure 9C:
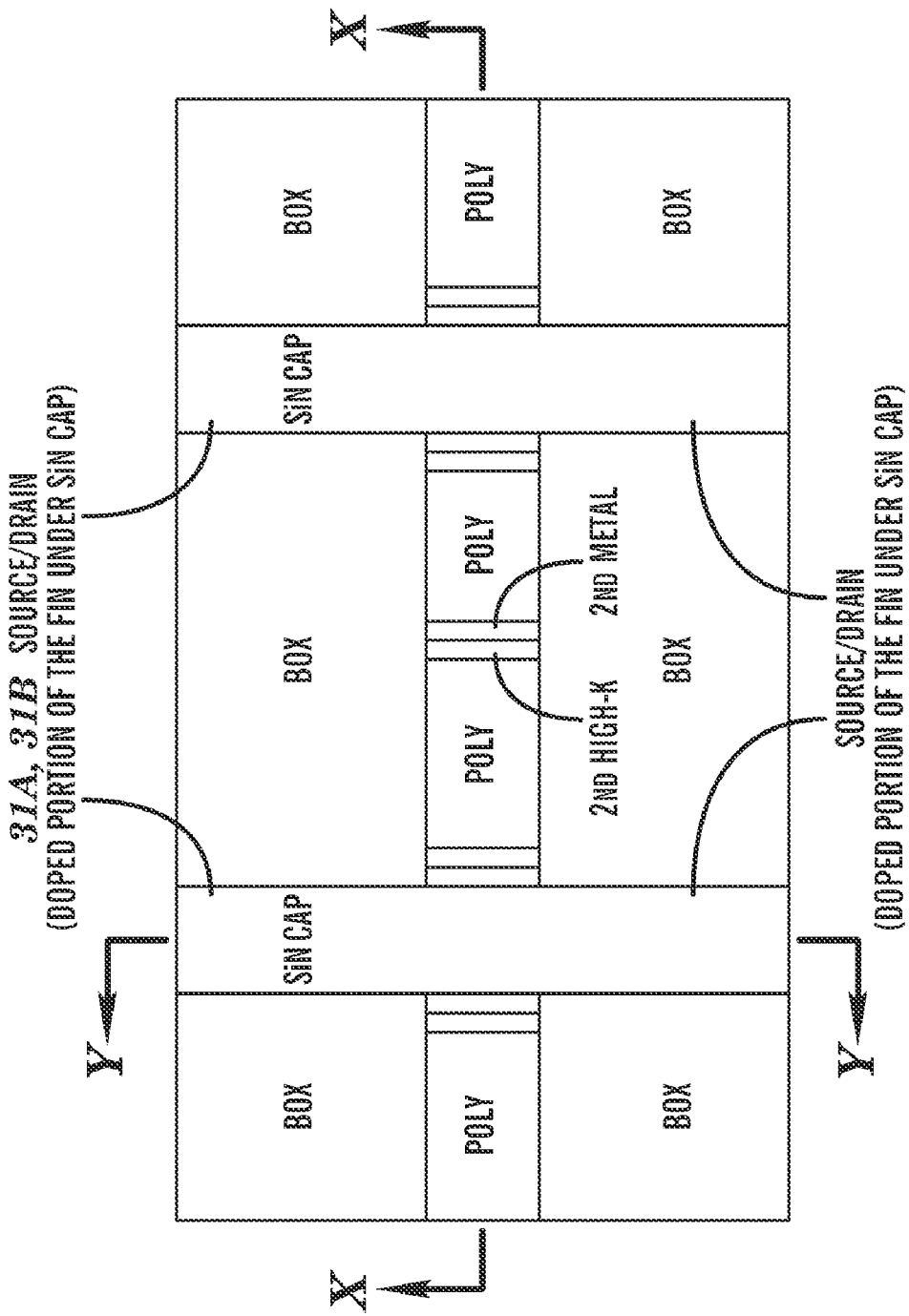

In FIGS. 9B, 9A and 9C, form suitable N and/or P source/drain regions 31A ,31B for the first gate and the second gate by conventional ion implantation or plasma doping. A suitable conventional annealing is performed to activate the dopants. The silicon fins under the gate poly are covered by the poly gate and SiN cap, and are not doped. See, for example, U.S. Pat. No. 6,992,354 B2 (incorporated by reference herein) for conventional details of source/drain formation techniques employable in the present invention. The doping is for N and P devices or alternatively both devices are N-doped or P-doped.

Figure 10A:
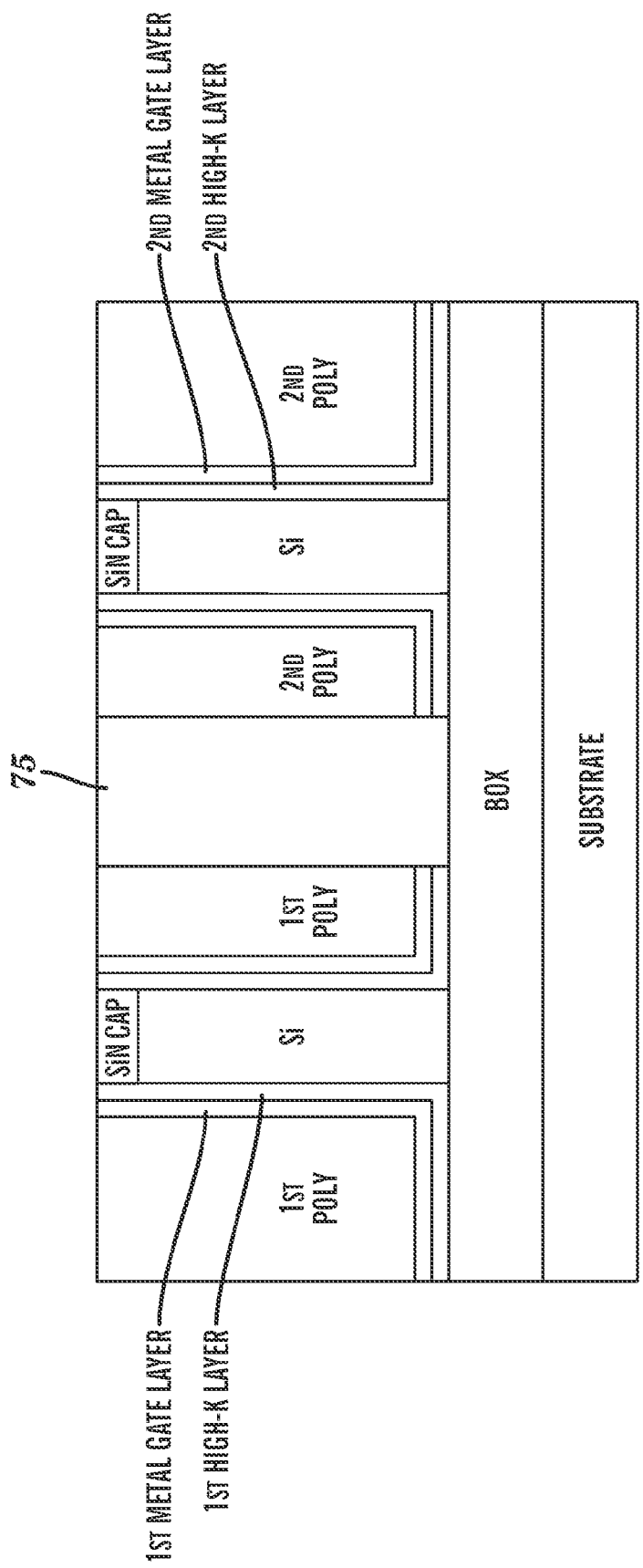
Figure 10B:
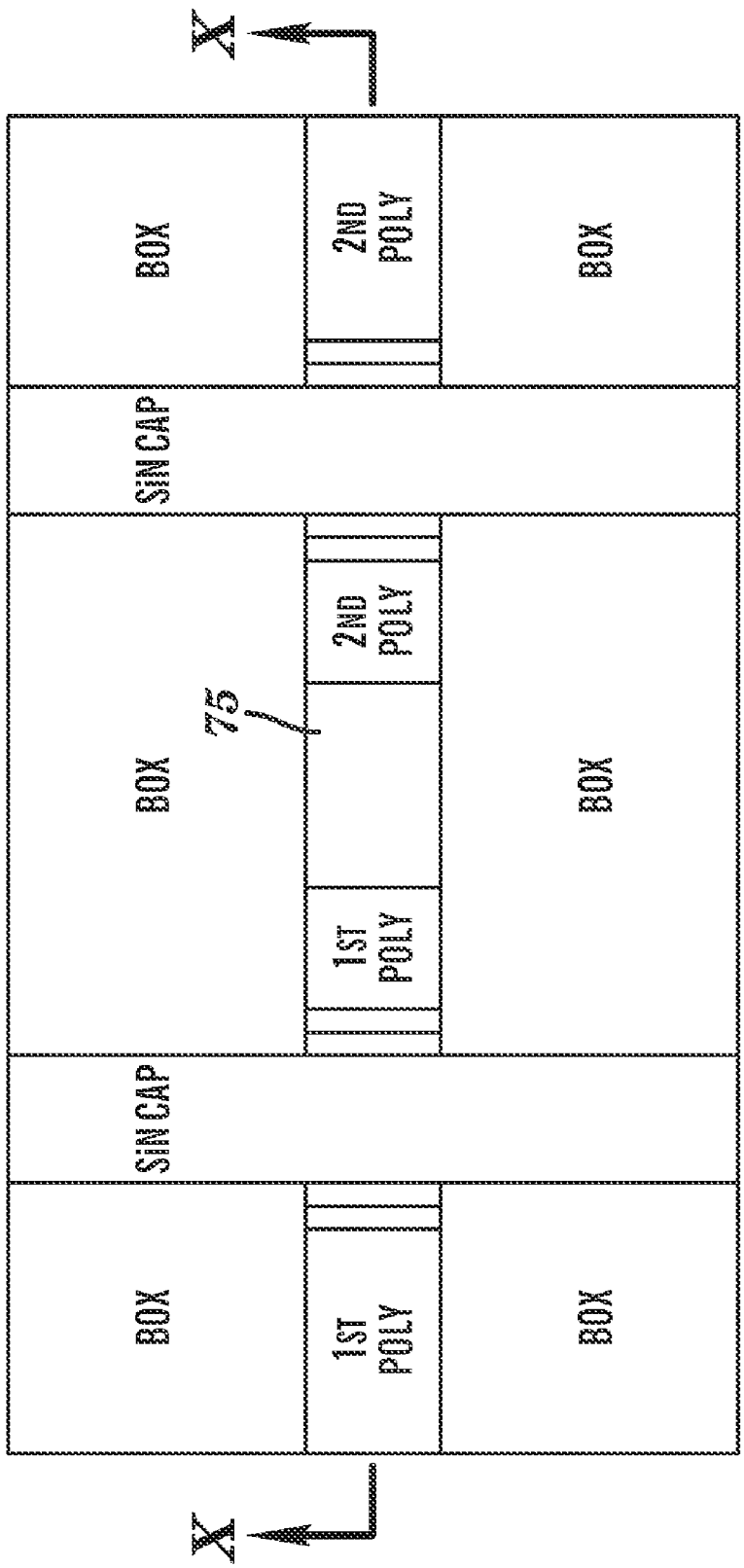
Figure 11:
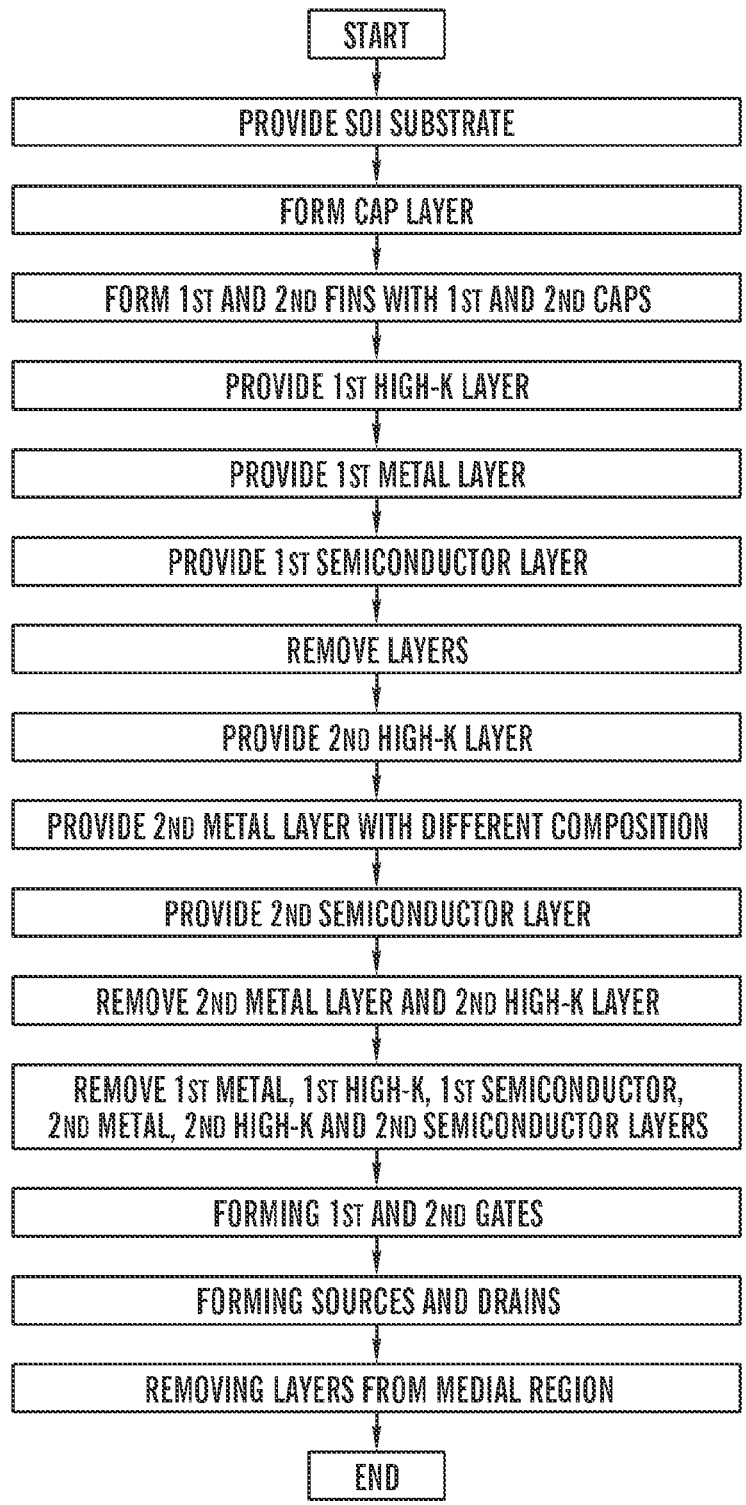
FIG. 11 is a flow chart showing various steps according to the preferred embodiment of the method according to the present invention.

Next, in FIGS. 10A and 10B, patterning (mask followed by etch) is performed to remove portions of the high-k and metal layers 50, 60, 500, 600 and polysilicon layers 70, 700 between the first FinFET and the second FinFET, to result in a final structure shown in FIGS. 10A (cross-sectional view) and 10B (top planar view). The final structure includes a hollow medial region 75 in which subsequent connections (not shown) can be made to the FinFETs. In general, the region 75 has preferably a "square-like" top cross-section as shown in FIG. 10B.

What is claimed is:

1. A method of making a FinFET device structure, comprising:
   providing a semiconductor-on-insulator (SOI) substrate having a semiconductor layer on an insulating layer on a base layer;
   forming a cap layer on the SOI substrate;
   forming, on the insulating layer, first and second semiconductor fins with a first cap layer on the first fin and a second cap layer on the second fin;
   providing a first high-k dielectric layer across the first and the second cap layers and the first and second fins;
   providing a first metal layer onto the first high-k dielectric layer;
   providing a first semiconductor layer onto the first metal layer;
   removing the first semiconductor layer, the first metal layer, and the first high-k dielectric layer from the second cap layer, the second fin and from regions adjacent to the second fin;
   providing a second high-k dielectric layer onto the second cap layer, the second fin and a portion of the first metal layer;
   providing a second metal layer onto the second high-k dielectric layer, the second metal layer having a composition different than the first metal layer;
   providing a second semiconductor layer onto the second metal layer in a region above the second cap layer and into the regions adjacent to the second fin;
   removing the second semiconductor layer from the second metal layer in the region above the second cap layer, from adjoining regions and from the regions adjacent to the second fin;
   removing the second metal layer and the second high-k dielectric layer from a region above the first cap layer and from adjoining regions above the first semiconductor layer;
   removing the first metal layer, the first high-k dielectric layer, the first semiconductor layer, the second metal layer, the second high-k dielectric layer and the second semiconductor layer from regions above a plane containing top surfaces of the first and the second cap layers;
   forming first and second gates;
   forming respective source and drain regions within portions of the first and the second fins adjacent to the first and second gates, and then
   removing portions of the first and the second semiconductor layers, the first and the second high-k dielectric layers and the first and the second metal layers from a medial region between the first and the second fins.

2. The method as claimed in claim 1, further comprising forming the first and second fins such that each fin has an approximately equally uniform single width in a range of approximately 20 nm to approximately 50 nm.

3. The method as claimed in claim 1, further comprising forming the first and second fins such that each fin has an approximately equal maximum height in a range of 15 nm to 40 nm.

4. The method as claimed in claim 1, the first metal layer having a chemical composition different than a chemical composition of the second metal layer.

5. The method as claimed in claim 1, the first high-k dielectric having a chemical composition different than a chemical composition of the second high-k dielectric.

6. The method as claimed in claim 1, the first metal layer having final dimensions different than the second metal layer.

7. The method as claimed in claim 1, wherein each of the first fin and the second fin has an equal and an approximately uniform width (W) selected from the range of widths from 5 nm to 300 nm.

8. The method as claimed in claim 1, wherein the first metal layer has a chemical composition different than a chemical composition of the second metal layer.

9. The method as claimed in claim 1, wherein the first cap layer and the second cap layer have an approximately equal thickness (T) selected from a range of approximately 20 nm to approximately 50 nm.

10. The method as claimed in claim 1, wherein the first semiconductor fin and the second semiconductor fin have an approximately equal height (H) selected from a range of approximately 15 nm to approximately 40 nm.

11. The method as claimed in claim 1, wherein the first semiconductor fin and the second semiconductor fin have an approximately equal width (W) selected from a range of approximately 10 nm to approximately 100 nm.

12. The method as claimed in claim 1, wherein the first metal layer and the second metal layer have substantially different final thicknesses selected from a range of approximately 50 Angstroms to approximately 100 Angstroms.

* * * * *